(12) United States Patent
Chanchani (10) Patent No.: US 7,335,972 B2
(45) Date of Patent: Feb. 26, 2008

(54) HETEROGENEOUSLY INTEGRATED MICROSYSTEM-ON-A-CHIP

(75) Inventor: Rajen Chanchani, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 591 days.

(21) Appl. No.: 10/713,374

(22) Filed: Nov. 13, 2003

(65) Prior Publication Data

US 2007/0158787 A1 Jul. 12, 2007

(51) Int. Cl.
*H01L 23/58* (2006.01)
*H01L 23/48* (2006.01)
*H01L 23/64* (2006.01)
*H01L 23/52* (2006.01)
*G01R 31/28* (2006.01)

(52) U.S. Cl. ......... 257/686; 257/E23.01; 257/E23.172; 257/777; 257/723; 257/668; 257/774; 257/679; 257/724; 257/780; 257/773

(58) Field of Classification Search ......... 257/E23.01, 257/E23.172, 686, 685, 723, 777, 724, 728, 257/780, 680, 681, 774, 773, 678, 679; 174/52.4
See application file for complete search history.

(56) References Cited

U.S. PATENT DOCUMENTS

| | | | |
|---|---|---|---|
| 6,267,644 B1* | 7/2001 | Molnar | 451/41 |
| 6,365,975 B1* | 4/2002 | DiStefano et al. | 257/777 |
| 6,728,113 B1* | 4/2004 | Knight et al. | 361/760 |
| 6,784,020 B2* | 8/2004 | Lee et al. | 438/106 |
| 6,802,489 B2* | 10/2004 | Marr et al. | 251/129.14 |
| 6,838,362 B2* | 1/2005 | Mastromatteo et al. | 438/524 |
| 6,865,089 B2* | 3/2005 | Ho et al. | 361/761 |
| 6,889,431 B2* | 5/2005 | Okabe et al. | 29/847 |
| 6,919,508 B2* | 7/2005 | Forcier | 174/52.4 |
| 6,933,601 B2* | 8/2005 | Satoh et al. | 257/698 |
| 6,961,230 B2* | 11/2005 | Otsuka et al. | 361/306.2 |
| 7,002,075 B2* | 2/2006 | Kambe et al. | 174/52.1 |
| 2004/0041270 A1* | 3/2004 | Shimizu et al. | 257/758 |
| 2004/0087043 A1* | 5/2004 | Lee et al. | 438/6 |

OTHER PUBLICATIONS

Vendier et al., Proc.2001 Electronic Components and Technology Conference, (2001).
Tomita et al., Proc. 2001 Electronic Components and Technology Conference, (2001).
Takahashi et al., Proc. 2001 Electronic Components and Technology Conference, (2001).
Umemoto et al., Proc. 2002 Electronic Components and Technology Conference, 1454 (2002).
Ramm et al., Microelectronic Eengineering 37/38, 39 (1997).

(Continued)

*Primary Examiner*—Alexander Oscar Williams
(74) *Attorney, Agent, or Firm*—Kevin W. Bieg (57) ABSTRACT

A microsystem-on-a-chip comprises a bottom wafer of normal thickness and a series of thinned wafers can be stacked on the bottom wafer, glued and electrically interconnected. The interconnection layer comprises a compliant dielectric material, an interconnect structure, and can include embedded passives. The stacked wafer technology provides a heterogeneously integrated, ultra-miniaturized, higher performing, robust and cost-effective microsystem package. The highly integrated microsystem package, comprising electronics, sensors, optics, and MEMS, can be miniaturized both in volume and footprint to the size of a bottle-cap or less.

12 Claims, 7 Drawing Sheets

OTHER PUBLICATIONS

Standjord et al., Int. J. Microcircuits and Electronic Packaging 19(3), 260 (1996).

Lenihan et al., Proc. 1996 Electronic Components and Technology Conference, pp. 119-124, Orlando, May 28-31, 1996.

Kambe, et al., Proc. 41st ECTC Conference, pp. 14-19, (1991).

Kole et al., Proc., 3rd Symposium on Adv. Packaging Materials, Atlanta, pp. 71-74 (1997).

Niklaus, et al., J. Micromech. Microeng. 11, 100 (2001).

Spiesshoefer et al., Proc. 2003 Electronics Components and Technology Conference, 631 (2003).

* cited by examiner

HETEROGENEOUSLY INTEGRATED MICROSYSTEM-ON-A-CHIP

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to microsystems packaging and, more particularly, to an apparatus and method for integrating heterogeneous microsystems devices on a single chip.

BACKGROUND OF THE INVENTION

Microsystems packaging involves the assembly and interconnection of microelectronics, microelectromechanical systems (MEMS), photonics, RF/wireless, fluidic, and other microscale devices into a system-level board or chip to form an integrated microsystems product. Microsystems packaging must satisfy more complex and diverse requirements than a strictly microelectronic package. In addition to the interconnection of electrical components, microsystems packaging requires the interconnection of actuators, sensors, and other devices. In addition, a microsystem package must provide for environmental protection, thermal management, mechanical support, power and signal distribution, testing, and connection with the outside world. Therefore, packaging often controls the microsystem's performance, cost, size, and reliability. Portable products, in particular, are driving the development of very dense packaging concepts comprising integrated electronic, optical, mechanical, chemical, and biological functions. A major roadblock in developing a highly miniaturized microsystem is the difficulty in integrating the different device technologies in a small volume. However, packaging concepts are evolving toward the full integration of a variety of functions into a complete system on a single chip.

Figure 1:
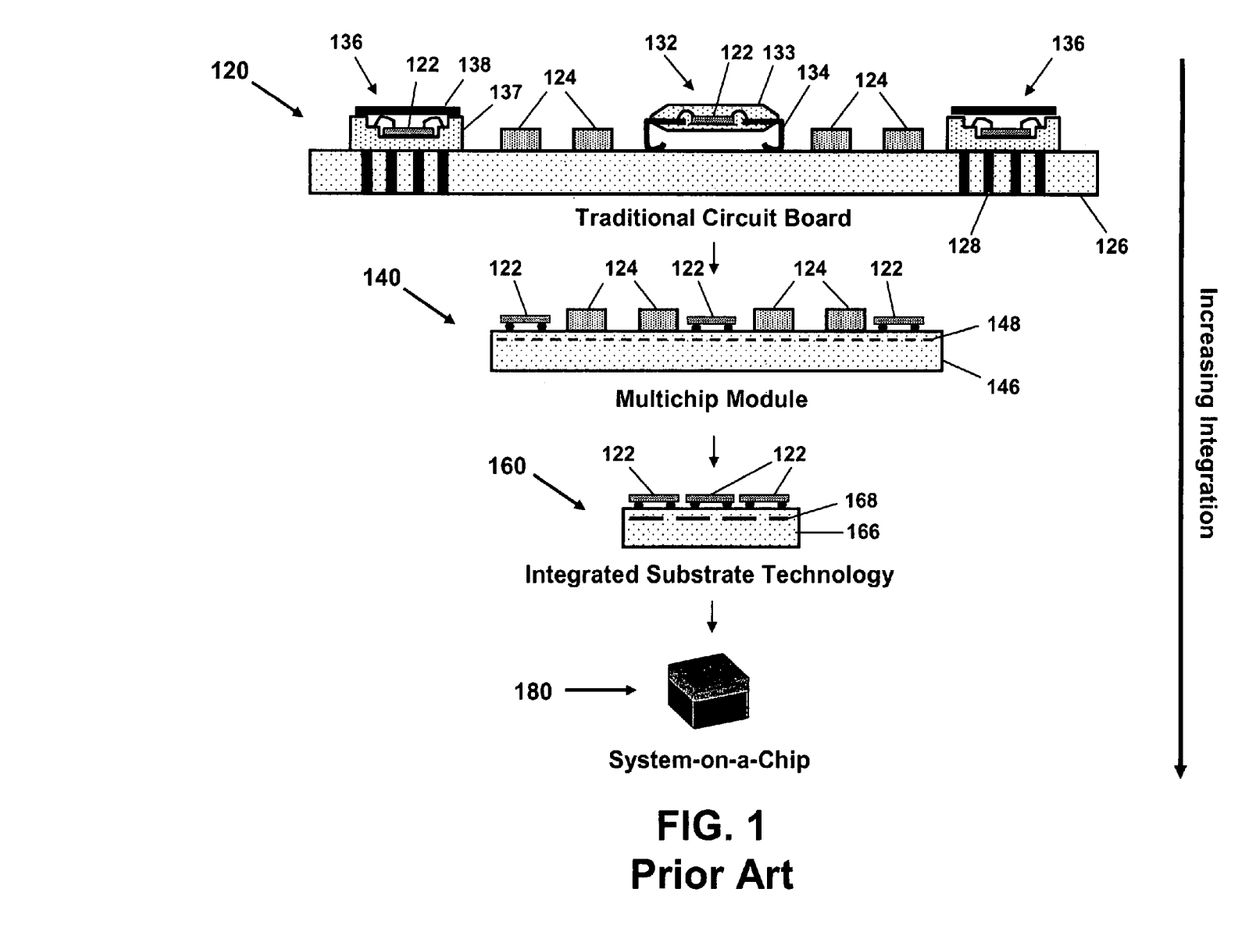
FIG. 1 shows a schematic illustration of a several microelectronics packaging concepts.

As shown in FIG. 1, microelectronics packaging involves multiple levels of integration. A traditional circuit board 120 comprises integrated circuits (ICs) 122 and passives 124 that are individually packaged, attached to a printed wiring board (PWB) 126 and interconnected by external wiring lines (e.g., copper foil tracks) on the surface of the PWB 126. Single chip packages 132 and 136 typically comprise the electrical component, a bonding structure of the component to the package, and a means to attach the package to the PWB 126. For example, for surface mount assembly of a plastic package 132 the IC 122 can be encapsulated in a plastic 133 and wirebonded to a lead frame 134 that is solder-bonded to electrically conductive pads on the PWB 126. In a ceramic package 136 the IC 122 can be wirebonded to a ceramic chip carrier 137 that is bonded to the PWB 126 by a ball grid array, or the like. The ceramic package 136 can be hermetically sealed by a metal cap 138. In addition to active devices, the microelectronics package can also comprise discrete and/or integrated passive devices (IPDs) 124, such as resistors and capacitors, surface mounted in a hybrid fashion on the PWB 126. Power can also be brought into and signals taken out of the active devices by plated through-holes or vias 128.

With the PWB, the best miniaturization that can be achieved provides a footprint that is the sum-total of the single-chip packages, passives, and interconnection areas. Furthermore, the high frequency electrical performance of in-plane hybrid circuits can be degraded, as a result of transmission line effects and circuit parasitics, thus limiting such packages for RF applications. In addition, wirebonds or solder joints pose a major reliability concern in such hybrid packages.

At the next level of integration, a multichip module (MCM) 140 comprises bare chips 122 and passives 124 mounted directly to a common substrate/package structure that replaces the chip-level packaging of the traditional circuit board. The MCM substrate 146 can comprise a deposited metal/dielectric multilayer structure on a base layer, a thick-film or cofired multilayer ceramic, or an organic laminate multilayer structure. The MCM substrate 146 provides signal input/output connections for the chips, signal interconnection through conducting layers 148 sandwiched between the multilayer dielectric structure, thermal management, mechanical support, and environmental protection. The bare chips 122 can be placed close together and directly bonded to the substrate 146 by the use of flip chip or other direct chip attach technology. This saves the weight and volume of individual chip packaging, significantly reducing the footprint of the MCM 140. The MCM 140 can be hermetically sealed in ceramic or metal packages or encapsulated in plastic (not shown). The MCM 140 typically enables a higher packaging efficiency, better electrical performance, greater reliability, and lower cost than the traditional circuit board 120.

As an approach to building a more compact, three-dimensional (3D) package, integrated substrate technology 160 uses passives that are embedded (i.e., integral passives 168) as part of the fabrication of the multilayer substrate 166. Bare chips 122 can be assembled directly above the embedded passives 168, shortening interconnection distances and thereby further improving electrical performance and enabling higher packaging efficiency, lower assembly costs, and small size and weight. However, such integral substrates 166 require new designs, test systems, manufacturing processes, and materials and can therefore by more costly to develop and have a longer time-to-market than with PWB or MCM packages 120 or 140.

Fully 3D integration of components is being developed, as a result of the increasing demand for portability and miniaturization. Therefore, the longer-term goal of modern packaging is the system-on-chip (SOC) 180. Hybrid SOC packaging uses thinned silicon chips that are stacked on top of a bottom wafer of normal thickness and interconnected by vertical electrical connections. Therefore, the SOC package can provide a high level of vertical integration and interconnection, such that the package footprint is the size of the largest component. In addition, stacking and interchip wiring may provide improvements in performance and reliability. In particular, interconnect delays can be dramatically reduced by replacing long in-plane interconnects with through-wafer via interconnects.

There are several hybrid SOC packaging concepts being developed worldwide. One approach uses a modification of MCM packaging technology. In this stacked MCM approach, multiple physical layers are built-up, starting with a first physical layer comprising thinned dies mounted on a substrate carrier. The in-layer dies can be interconnected with several metal deposition and etching steps, using spin-on polymer with corresponding via formation. Additional physical layers are then built up from an insulating and planarizing polymer layer on the first physical layer. While providing many of the advantages of the MCM packaging in a stacked 3D package, handling thin dies can be challenging and parallel assembly of individual chips does not provide the efficiencies of wafer-level packaging. See Vendier et al., "Ultra Thin Electronics for Space Applications," *Proc.* 2001 *Electronic Components and Technology Conference* (2001), which is incorporated by reference.

Another SOC concept uses flip-chip interconnection to build a chip-on-chip (COC) structure. With the COC structure, through-hole copper electrodes on the periphery of thinned silicon chips are connected to electroplated gold micro bumps on the underlying wafer by thermal compression flip-chip bonding. The narrow gap between the stacked chips is then encapsulated with an epoxy underfill resin having a low coefficient of thermal expansion (CTE) that is filled with hyperfine filler particles to reduce the thermal stress of the micro bumps. Using these techniques, the micro bumps can have a pitch of about 20 microns and the interchip wiring length can be short. However, the chips are stacked after dicing, rather than at the wafer level, and the thermocompression bonding process can require relatively high temperatures and bonding forces. See Tomita et al., "Advanced Packaging Technologies on 3D Stacked LSI utilizing the Micro Interconnections and the Layered Microthin Encapsulation," *Proc.* 2001*Electronic Components and Technology Conference* (2001); Takahashi et al., "Development of Advanced 3D Chip Stacking Technology with Ultra-Fine Interconnections," *Proc.* 2001 *Electronic Components and Technology Conference* (2001); and Umemoto et al., "Superfine Flip-Chip Interconnection in 20 µm-Pitch Utilizing Reliable Microthin Underfill Technology for 3D Stacked LSI," *Proc.* 2002*Electronic Components and Technology Conference*, 1454 (2002), which are incorporated herein by reference.

Recently, vertically integrated circuits have been fabricated at the wafer level using stacking of thinned wafers and vertical interchip wiring. Vertical electrical connections are formed between the uppermost metal layers of the bonded wafers by fabrication and metal refill of high aspect ratio interchip vias. However, this requires that the I/O pads of the adjoining stacked wafers be precisely located over each other to make the vertical electrical connections. Therefore, the bonding process requires a precise optically adjusted alignment process to carefully adjust the lithographic levels of the top and bottom wafers. Furthermore, the process uses polyimide as the intermediate glue layer. Polyimide requires a high temperature cure (i.e., about 380° C.), is hydrophilic (i.e., moisture absorption of about 2%), and is conformal, necessitating that the polyimide be coated on a relatively featureless bottom wafer surface. Finally, this process does not provide for the inclusion of additional interconnect circuitry and passives in the intermediate layer. See Ramm et al., "Three dimensional metallization for vertically integrated circuits," *Microelectronic Engineering* 37/38, 39 (1997), which is incorporated herein by reference.

The microsystem-on-a-chip (µSOC) technology of the present invention addresses the need for heterogeneously integrated, ultra-miniaturized, higher performing, robust and cost-effective microsystem package. The µSOC is a modular, multi-function, multi-chip stacked package that provides all of the needed system-level functions. A highly integrated microsystem package, comprising electronics, sensors, optics, and MEMS, can be miniaturized both in volume and footprint to the size of a bottle-cap or less. Furthermore, the µSOC package eliminates the use of wirebonds and solder joints, thus making the package inherently more robust for applications exposed to extreme mechanical shock and vibration environments. The µSOC package will enable wireless distributed sensor systems comprising miniaturized, unattended, unobtrusive, surveillance devices for monitoring for military battlefields, infrastructure systems, and manufacturing processes.

SUMMARY OF THE INVENTION

The present invention is directed to a microsystem-on-a-chip, comprising a bottom chip comprising one or more microsystem devices with associated input/output pads on the top surface of the bottom chip; an interconnect layer on the top surface of the bottom chip, the interconnect layer comprising a compliant dielectric material and an interconnect structure embedded in the compliant dielectric material, the interconnect structure comprising one or more via capture pads connected to the associated input/output pads on the top surface of the bottom chip; and a thin upper chip on the interconnect layer, the thin upper chip comprising one or more microsystem devices with associated input/output pads on the top surface of the thin upper chip that are connected to the one or more via capture pads in the interconnect layer by conductive vias through the thin upper chip. The microsystem-on-a-chip of can further comprise at least one additional stacked layer on the thin chip. The interconnect layer can further comprise at least one passive component, such as a thin-film resistor, multi-layer capacitor, or spiral inductor. The compliant dielectric material can be an organic polymer, such as benzocyclobutene.

The present invention further includes a method for fabricating a plurality of microsystems-on-a-chip, comprising providing a bottom wafer comprising a plurality of chips, each chip comprising one or more microsystem devices with associated input/output pads on the top surface of the bottom wafer; forming an interconnect layer on the top surface of the bottom wafer, the interconnect layer comprising a compliant dielectric material and an interconnect structure embedded in the compliant dielectric material, the interconnect structure comprising one or more via capture pads connected to the associated input/output pads on the top surface of the bottom wafer; bonding a thin upper wafer to the interconnect layer, the thin upper wafer comprising a plurality of chips, each chip comprising one or more microsystem devices with associated input/output pads on the top surface of the thin upper wafer that are connected to the one or more via capture pads in the interconnect layer by conductive vias through the thin upper wafer; and singulating the plurality of chips from the bottom wafer, the interconnect layer and the thin wafer. The interconnection vias can be fabricated either before, or after, the wafers are bonded together.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 2:
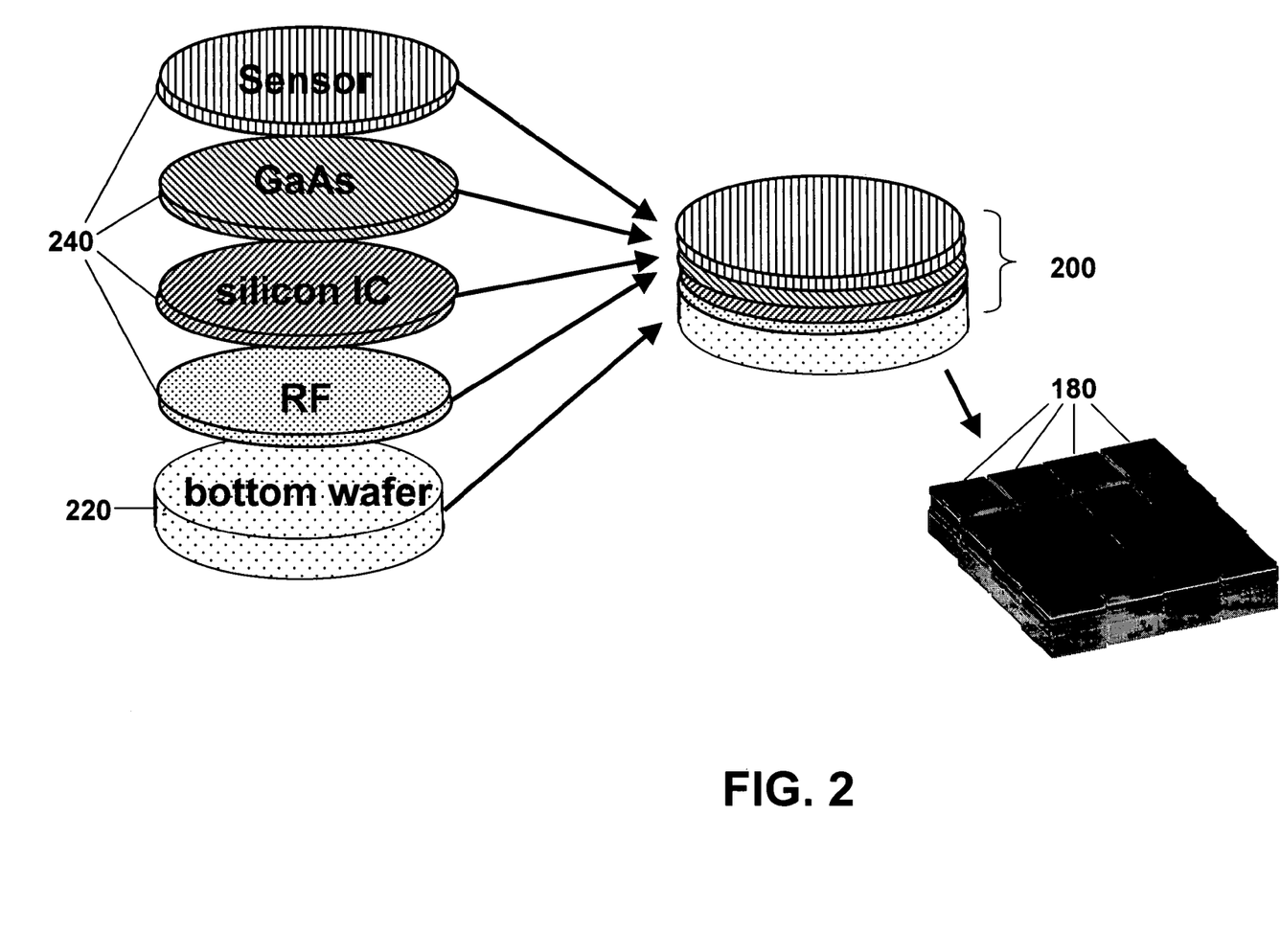
FIG. 2 shows a schematic illustration of the microsystem-on-a-chip package.

In FIG. 2 is shown an example of the microsystem-on-a-chip package of the present invention in which different device technologies can be heterogeneously integrated in a 3D stack as a single chip. The stacking method can be used to integrate widely different materials used in the IC and MEMS industries, such as silicon, compound semiconductors, glass, and ceramics, and different types of devices like CMOS, memory, photonic, sensors, RF and passive components by a batch process at the wafer level. Any significant stresses associated with thermal expansion mismatch between different materials in the layers of the stack 200 can potentially cause delamination, cracking or bending. Therefore, a bottom wafer 220 of normal thickness can be a relatively rigid and the stacked wafers 240 can be thin so that their individual contribution to thermal expansion mismatch stresses are minimal. On top of the bottom wafer 220, the series of thinned wafers 240 can be stacked, glued and electrically interconnected. An interconnect layer 230 between each wafer provides additional compliance to the stacked structure 200. Therefore, a thinned wafer fabricated in one technology can be wafer-level attached on top of another wafer fabricated in another technology. Preferably, the top wafer can be a sensor layer to enable probing of the external environment in order to measure a chemical, biological, or physical effect. The on-board circuitry can be buried in the stack for environmental protection and low-loss signal propagation.

The wafer stack 200 can be singulated into single chips 180 by standard dicing methods. Each 3D stacked chip 180 can be a self-contained microsystem having approximately the same area and volume as a single IC. The top or the bottom surface of the stacked chip 180, if needed, can be made available for attachment of discrete devices, MEMS, batteries, antennas or commercial-off-the-shelf (COTS) surface mount components. The modular 3D stack achieves the goals of monolithic integration at a small fraction of the cost of conventional microsystems packaging. In particular, since it is a wafer-level process, the processing cost per die is minimal.

Figure 3:
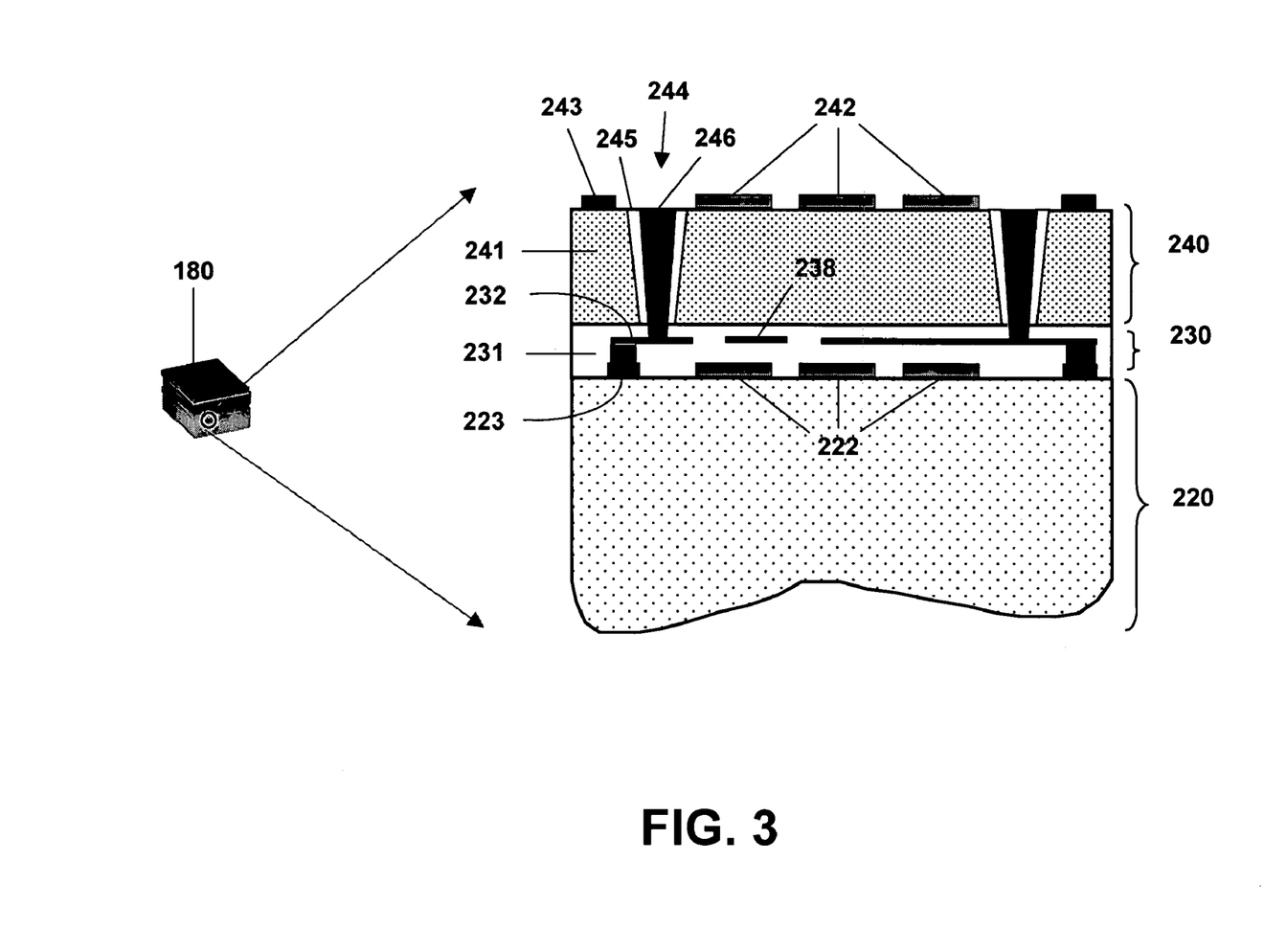
FIG. 3 shows a cross-sectional side view of a singulated chip from the bottom two wafers in a multi-wafer stack.

In FIG. 3 is shown a cross-sectional side view of a portion of the bottom two wafers 220 and 240 of the multi-wafer stack 200 that can be singulated into a single chip 180. Each wafer 220 and 240 can have one or more microsystems devices 222 and 242 per chip with associated input/output (I/O) pads 223 and 243 on the uppermost surfaces of the wafers 220 and 240. The bottom wafer 220 can comprise silicon, alumina, or a low-temperature co-fired ceramic (LTCC) of normal thickness (e.g., 600 microns thickness). The upper thinned wafer 240 (e.g., 20 to 120 microns thickness) comprises a plurality of conductive through vias 244 that enable vertical, interchip electrical connection. The interconnect layer 230 comprises a compliant dielectric material 231 that attaches the two wafers 220 and 240. The interconnect layer 230 further comprises a high-density interconnect structure embedded in the dielectric material 231 that is electrically connected to the conductive interchip vias 244 and allows signal redistribution between the I/O pads 223 and 243 of the upper and bottom wafers 220 and 240. This interconnect structure comprises via capture pads 232 that enable the wafers to be stacked without requiring the I/O pads 223 and 243 of adjoining wafers to be located over each other. Furthermore, passive components 238, comprising thin film resistors, capacitors, and inductors, can be embedded in the interconnect layer 230 to provide greater flexibility and further miniaturization than is possible with discrete passive components.

The interconnect layer 230 comprises a compliant dielectric material 231 that can be used to glue the two wafers 220 and 240 together. The compliant dielectric material 231 is preferably a polymer. The polymer should provide adhesion of the two adjoining wafers and should be able to withstand the mechanical, thermal, and chemical conditions encountered during the subsequent wafer stacking processes. Furthermore, the thickness of the interconnect layer 230 should be thin, preferably less than about 50 microns, yet thick enough to reduce residual stress and provide adequate insulation and planarization of the underlying topology.

The polymer is preferably benzocyclobutene (BCB). BCB is a thermosetting polymer that is inert to most chemicals, can be used with a variety of substrate materials, and has very good spin-on planarization, good adhesion, low susceptibility to cracking, and low moisture absorption. BCB has a glass transition temperature of about 350° C., providing good long-term stability. The bonding temperature can be below 250° C., so that the packaging method is compatible with CMOS circuitry. Because BCB is self-planarizing, surface planarity of the interconnect layer can be better than that obtained with a conformal coating. This property is desirable for smoothing the rough topology provided by the Microsystems devices 222, embedded passives 238, and interconnect circuitry 223 and 232, enabling the void-free stacking of multiple wafers. In addition, BCB has a relatively low dielectric constant (i.e., about 2.65), enabling high speed signal propagation and reduced capacitive coupling and cross-talk between the interconnection lines. Although the use of any organic polymer as a glue layer prevents a truly hermetic package, BCB absorbs almost an order of magnitude less moisture in humid environments then polyimide. Other compliant dielectric materials, including inorganics and organic/inorgranic hybrids, can also be used to bond the wafers together, depending on the application and processing requirements.

The interconnect layer 230 further comprises a multilayer, high-density interconnect structure embedded in the dielectric glue material 231 that allows signal redistribution between the I/O pads 223 and 243 on the uppermost surfaces of the two wafers 220 and 240. Electrically conducting interchip vias 244 provide vertical electrical connections between the stacked devices. Because the stacked wafers are thin, the vias can have a low aspect ratio that can still be easily metallized. The vias 244 can be insulated from the wafer material 241 with a dielectric coating 245 and filled with a conducting material (e.g., a metal) 246. Because of the difficulty in aligning all of the vias 244 between multiple stacked wafers having very high I/O density devices, the interconnect structure can comprise large via capture pads 232 on the lower wafer 220. The size of these via capture pads 232 can be adjusted to control the alignment tolerance. The interconnect structure can be fabricated using a good electrical conductor, such as copper, to provide for fast signal speed and low power dissipation.

The interconnect layer 230 can also accommodate embedded passive components 238, such as resistors, capacitors and inductors. Thin film resistors can comprise patterned layers of resistive material embedded in the interconnect dielectric 231 and electrically connected to the interconnect structure. Embedded capacitors can be built in polymer/copper multi-layers by sandwiching layers of dielectric between copper electrodes. Inductors can comprises 2D and 3D spiral structures made of copper embedded in the interconnect dielectric 231.

The fabrication method of the present invention uses an aligned bonding process for wafer-level stacking of devices with interchip via connection and with capability to reroute interconnections between levels. The method does not require any extreme temperature, pressure, voltage or chemical environment. The method comprises wafer thinning and handling, interconnect layer formation, aligning and bonding of the two wafers, and interchip via formation and metallization to provide electrical interconnection between the wafers in the vertical stack. The aligned bonding process preferably comprises bonding the wafers together with an polymeric dielectric, such as BCB, as a glue. The interconnection vias can be fabricated either before, or after, the wafers are bonded together.

In FIGS. 4A-4E is shown a wafer-stacking method wherein the interchip vias are fabricated prior to bonding of the wafers together.

Figure 4A:
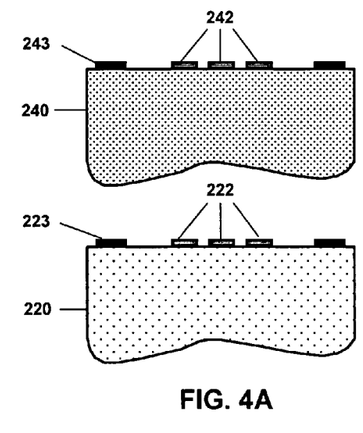
FIGS. 4A-4E show a wafer-stacking method wherein interchip vias are formed prior to the bonding of the two wafers together.

In FIG. 4A, a bottom wafer 220 and an upper wafer 240 each comprise one or more devices 222 and 242 with associated I/O pads 223 and 243 constructed on the top surface of a thick wafer.

Figure 4B:
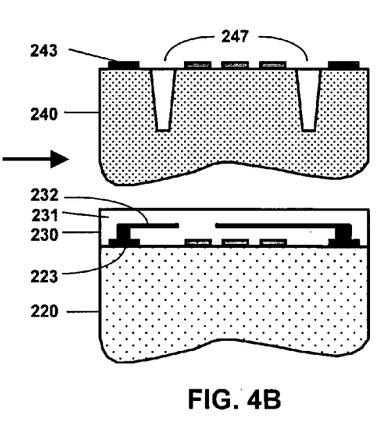

In FIG. 4B, blind via holes 247 are formed that extend from the I/O pads 243 on the top surface to part way through the thick upper wafer 240. The blind vias 247 can extend to a depth greater than the final thickness of the upper wafer 240 after thinning. The blind vias 247 can be formed by a variety of directional etching processes, such as reactive ion etching, Bosch etching, or laser drilling. These techniques can typically provide vias with diameters of about 25 microns on a pitch of 50 microns, enabling high-density interconnections.

The interconnect layer 230 on the bottom wafer 220 comprises the dielectric glue material, the interconnect structure, and embedded passives. The dielectric glue material 231 can be coated on the top surface of the bottom wafer 220 to encapsulate the interconnect structure and enable bonding to the upper wafer 240. For example, the glue material 231 can comprise BCB polymer that is spun-on the topside of the bottom wafer 220. The BCB layer can be photodefinable or non-photodefinable (i.e., dry-etchable). Both the photosensitive and dry-etch grades are marketed as CYCLOTENE™ advanced electronic resins by the Dow Chemical Company. Photodefinable BCB is a negative acting photopolymer whereby the unexposed regions can be removed by a suitable developer. Each BCB layer of the multilayer interconnect structure can typically be 1 to 25 microns. Total BCB multilayer thickness can be about 50 microns or less.

The interconnect structure can comprise multiple patterned metal layers sandwiched between the dielectric layers. The conductor of the interconnect structure can comprise a thin titanium adhesion layer (e.g., 20 nm thickness) and a 2 to 20 microns thickness copper layer, depending on the thickness of the BCB layer. The copper lines can be patterned by etching, lift-off, or other patterning method. Via capture pads 232 can be formed in the interconnect layer 230 to align with the vias 244 from the upper wafer 240 and to redistribute the signals from the I/O pads 243 on the upper wafer with the I/O pads 223 on the bottom wafer. The size of the via capture pads 232 can be adjusted to control the alignment tolerance.

A process for building up a copper interconnect structure within a BCB intermediate layer is described by Strandjord et al., "Process Optimization and Systems Integration of a Copper/Photosensitive Benzocyclobutene MCM-D: Dielectric Processing, Metallization, Solder Bumping, Device Assembly, and Testing," *Int. J. Microcircuits and Electronic Packaging* 19(3), 260 (1996), which is incorporated herein by reference. The process used up to five metal layers embedded in sequentially deposited thin layers of photodefinable BCB. The process includes preparation of a wafer surface for reliable BCB bonding, spin-coating of a photosensitive BCB layer on the wafer surface, pre-exposure baking of the coated BCB at a low temperature, photolithography of the negative BCB layer, solvent development of the BCB resist material to form vias, soft-curing of the BCB to eliminate cracking and ensure resistance to subsequent processing, application and photolithography of a lift-off photoresist, copper metallization by evaporation, and solvent liftoff after metallization to provide the interconnect metal lines and via pads. The layer thickness of the photo-BCB was about 5 microns. Multiple layers of BCB polymer and metal can be built-up using this process. Layer-to-layer electrical connections can be accomplished with the metallized vias in the BCB layers onto metal capture pads in the underlying BCB layer. After build-up, the multiple layers can be hard-cured in an oven.

Thicker BCB layers may be desirable for some applications, for example to minimize insertion losses in RF circuits and maximize miniaturization. Thicker BCB layers (e.g., 20 microns) can be made with a non-photodefinable BCB that can be patterned by dry etching. The BCB in the exposed areas can be selectively removed to make the vias and streets by reactive ion etching (RIE) with an oxygen/fluorine mixture. The photolithographic pattern can be defined either by a hard mask (e.g., aluminum) or a soft mask (e.g., photoresist).

Embedded passives can be incorporated in the metal layers of the interconnect structure. For example, thin film resistors can be made of tantalum nitride (TaN), tantalum silicide (TaSi), nichrome (NiCr), or chrome silicide (CrSi). The resistivity can be varied by changing the composition, thickness, or meander pattern of the resistor. Typical embedded resistors have resistances of 10-10,000 ohms. Embedded capacitors can be built in BCB/copper multi-layers by sandwiching layers of $Ta/Ta_2O_5$ dielectric between copper electrodes. The capacitance can be varied by changing the capacitor area. Capacitance values of 50 pF to 100 nF at 1-100 MHz are typical. Smaller capacitors, less than about 1 nF, behave as lumped elements at less than about 100 MHz. Inductors can comprise 2D and 3D spiral structures made of copper embedded in the BCB dielectric. These spiral inductors behave as lumped elements with inductances of 1 to 40 nH at low frequencies. For higher frequencies (e.g., greater than 4 GHz), transmission lines can be used as inductors. Tolerance for most of these embedded passives can be less than +/−4%. See, e.g., T. Lenihan et al., "Thin Film Resistors, Capacitors, and Inductors in Flexible Polyimide Films," *Proc. 1996 Electronic Components and Tech. Conf.*, pp. 119-124, Orlando, May 28-31 (1996); R. Kambe et al., "Copper-Polyimide Multilayer Substrates for High Speed Signal Transmission," *Proc. 41st ECTC Conf.*, pp. 14-16 (1991); and R. R. Kola et al., "Thin Film Resistors and Capacitors for Advanced Packaging," *Proc. 3rd Int.*

Symposium on Adv. Packaging Materials, Atlanta, pp. 71-74 (1997); which are incorporated herein by reference.

Figure 4C:
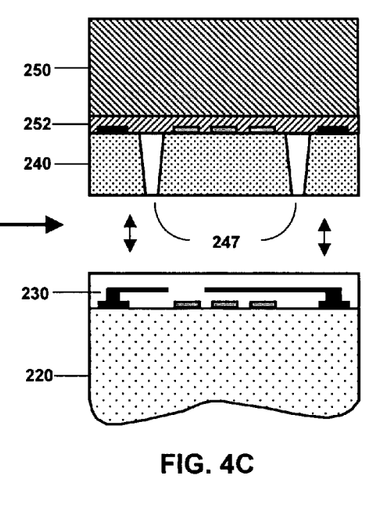
Figure 4D:
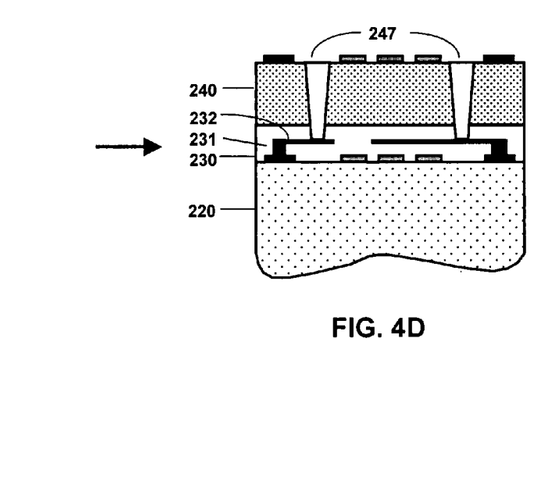

In FIG. 4C, the bottom side of the upper wafer 240 is partially removed to convert the blind via holes to through vias 247 and provide a thin, flexible upper wafer 240. The thinned upper wafer 240 can be aligned with and bonded to the planarized interconnect layer 230 on the bottom wafer 220 with the aid of a supporting carrier wafer 250 that is attached to the upper wafer 240 with an adhesive 252, according to the aligned bonding process described below.

In FIGS. 5A-5G is shown an aligned bonding process to thin the upper wafer 240 and bond the thinned upper wafer 240 to the bottom wafer 220.

Figure 5A:
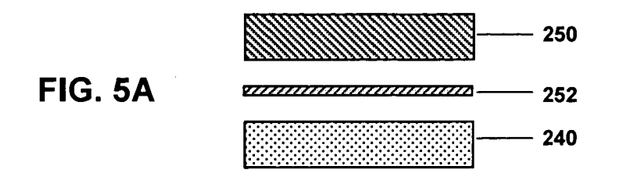
FIGS. 5A-5G show a method to thin an upper wafer and bond the thinned upper wafer to a bottom wafer.

In FIG. 5A is shown a carrier wafer 250, a double-sided adhesive tape 252, and the upper wafer 240 to be thinned. The carrier wafer 250 can be, for example, a planar glass wafer. The use of the carrier wafer 250 enables the upper wafer 240 to be handled similarly to a rigid, thick wafer during thinning and subsequent wafer bonding. The adhesive tape 252 can be a thermal self-release adhesive tape that allows the carrier wafer 250 to be cleanly and easily bonded and then de-bonded from the upper wafer 240 without affecting other materials used in the wafer bonding method. For example, the adhesive tape can be REVALPHA™ thermal release tape, manufactured by Nitto Denko, Inc. The REVALPHA™ tape has tiny gas bubbles that are entrapped in a polymeric adhesive. When the tape is heated above a self-release temperature, the trapped air bubbles expand, forcing the joined wafers to break loose. Therefore, the wafer release occurs without the application of additional applied force. Furthermore, the self-release process leaves no visual residue on the released surface of the upper wafer. The REVALPHA™ tapes are available with self-release temperatures of 90 to 170° C.

Figure 5B:
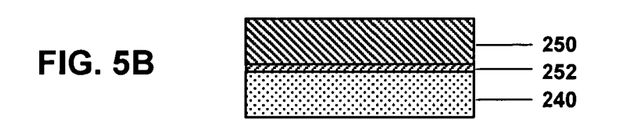

In FIG. 5B, the carrier wafer 250 is attached to the top surface of the upper wafer 240 (i.e., the upper wafer devices are not shown) using the adhesive tape 252. The attachment is preferably done in a clean room environment to prevent the entrapment of particulates that may create a hole or other damage to the upper wafer 240 when it is thinned.

Figure 5C:
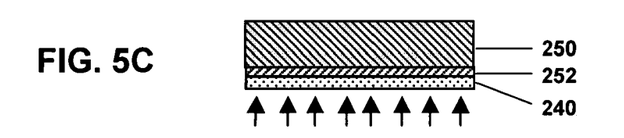

In FIG. 5C, the exposed bottom surface of the upper wafer 240 is thinned while being supported by the carrier wafer 250. The upper wafer 240 can be thinned (e.g., 20 to 120 microns thickness) by grinding, lapping, and/or polishing.

Figure 5D:
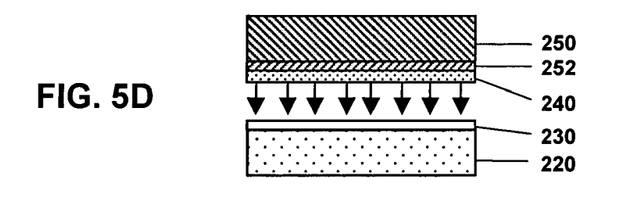

In FIG. 5D, the bottom surface of the thinned, carrier-supported upper wafer 240 is bonded to the planarized interconnect layer 230 on the top surface of the bottom wafer 220 (i.e., the bottom wafer devices are not shown). A low-temperature process using a polymer to bond wafers has been described by Niklaus et al., "Low-temperature full wafer adhesive bonding," *J. Micromech. Microenq.* 11, 100 (2001), which is incorporated herein by reference. Niklaus found that the polymer material, the bonding pressure, and the pre-curing time and temperature for the polymer significantly influence void formation at the bond interface. In the present invention, a similar low-temperature bonding process can be used to bond a thinned upper wafer, bonded to a carrier wafer with the thermal release tape, to the BCB interconnect layer on the bottom wafer. Excellent void-free and strong bonds have been achieved by bonding the carrier-supported upper wafer to the BCB-coated bottom wafer at temperatures of 80 to 150° C.

Preferably, the wafers 220 and 240 can be bonded in a wafer-bonding machine. The wafers can be heated to a temperature slightly below the self-release temperature of the thermal release tape (e.g., to below 90 to 170° C.) and the wafer bonding machine chamber can be evacuated. The wafers are preferably bonded, starting from the center of the aligned wafers and proceeding outwardly to the edges. This center-first bonding can be facilitated by the use of spacers situated around the periphery and between the to-be-bonded wafer surfaces. The spacers can be removed as the bonding force is applied outwardly.

Figure 5E:
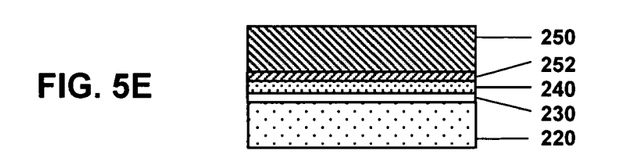

As shown in FIG. 5E, this process results in a uniform bond of the wafer surfaces together without trapping air bubbles. Acoustic imaging has shown the absence of air voids in the bond region when this method is used to bond the wafers 220 and 240.

Figure 5F:
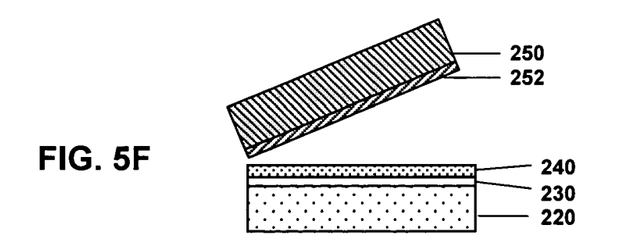

In FIG. 5F, the carrier wafer 250 and the adhesive tape 252 are released from the top surface of the upper wafer 240 by heating to a temperature in excess of the self-release temperature (e.g., to greater than 90 to 170° C.).

Figure 5G:
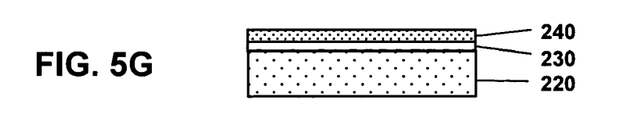

As shown in FIG. 5G, removal of the carrier wafer and adhesive provides the thinned upper wafer 240 bonded to the interconnect layer 230 of the thick bottom wafer 220. The bonded wafer stack can then be further processed.

Returning now to FIG. 4D, after the thinned upper wafer 240 is bonded to the thick bottom wafer 220 and the carrier wafer 250 is removed, the BCB interconnect layer material 231 can be soft cured at about 210° C. to further eliminate any air voids. The vias 247 can be then be further etched through the BCB 231, using the via holes in the upper wafer 240 as a mask, stopping at the via capture pads 232 in the interconnect layer 230.

Figure 4E:
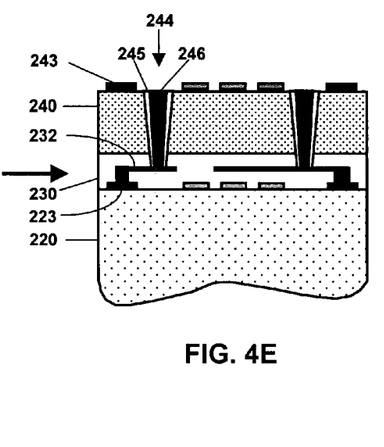

In FIG. 4E, the vias 244 can be coated with an insulating dielectric 245 and filled with a metal 246 to form a conducting plug. A suitable process for forming hollow vias, deposition of a insulating dielectric coating and seed layers on the interior surface of the hollow vias, and copper plating of the vias is described by Spiesshoefer et al., "IC Stacking Technology using Fine Pitch, Nanoscale through Silicon Vias," *Proc.* 2003 *Electronic Components And Technology Conference*, 631 (2003), which is incorporated herein by reference. The hollow vias are first cleaned to provide a pristine surface for subsequent insulating and metal layer depositions. The insulating dielectric coating 245 can be formed on the inside of the hollow vias to electrically isolate the metallized vias from the upper wafer material. The dielectric coating 245 can be, for example, silicon dioxide or BCB. Finally, conducting vias 244 can be formed through the upper wafer 240 and partially through the insulating layer 230 by metallization 246 of the via, for example using evaporative or electroplated copper. The metallized vias 244 thereby electrically connect the I/O pads 243 of the devices of the upper wafer 240 to the I/O pads 223 of the devices of the bottom wafer 220 by way of the via capture pads 232.

Figure 6A:
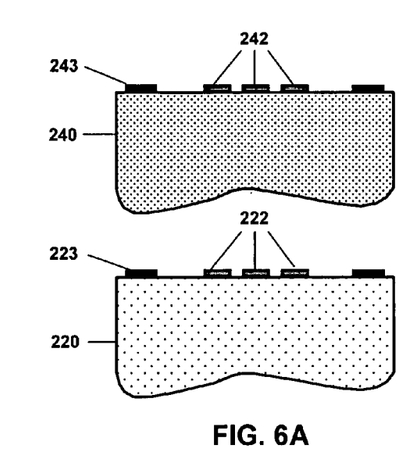
FIGS. 6A-6E show a wafer-stacking method wherein interchip vias are formed after the two wafers are bonded together.
Figure 6B:
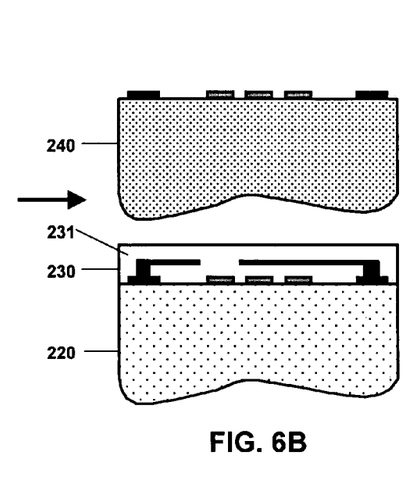
Figure 6C:
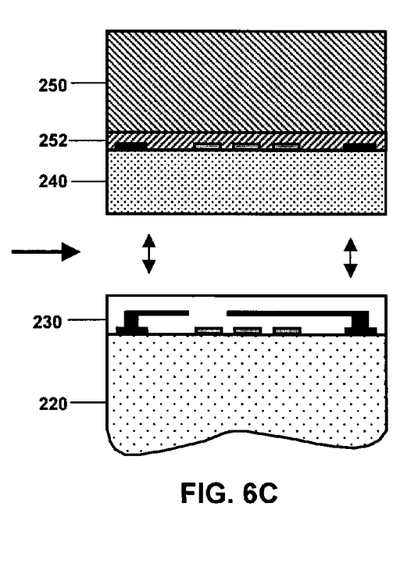
Figure 6D:
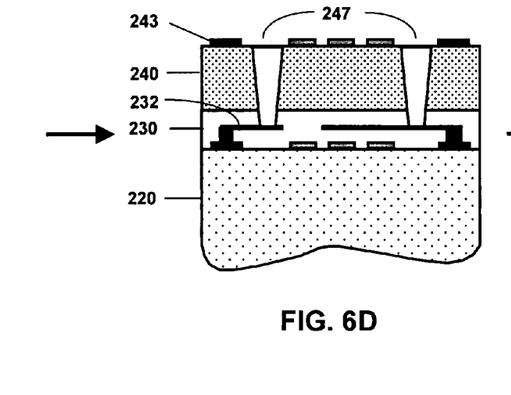
Figure 6E:
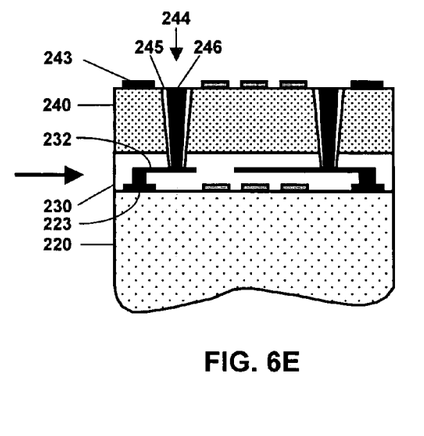

In FIGS. 6A-6E is shown a wafer-stacking method wherein the interchip vias are formed after the wafers are bonded, using the processes described above. In FIG. 6A is shown a bottom wafer 220 and an upper wafer 240, each comprising one or more devices 222 and 242 with associated I/O pads 223 and 243 constructed on the top surface of a thick wafer. In FIG. 6B, the interconnect layer 230 is formed on the bottom wafer 220, comprising an interconnect structure that is encapsulated in the interconnect layer material 231. In FIG. 6C, the carrier-supported thinned upper wafer 240 is aligned and bonded to the top surface of the planarized interconnect layer 230 on the bottom wafer 220. In FIG. 6D, hollow vias 247 are formed that extend from the I/O pads 243 on the top surface of the bonded upper wafer 240 through to the via capture pads 232 in the interconnect layer 230. In FIG. 6E, the hollow vias 247 are lined with a dielectric coating 245 and filled with a metal 246 to form metallized vias 244 that provide an electrical connection from the I/O pads 243 of the upper wafer 240 to the I/O pads 223 of the bottom wafer 220.

Additional thinned wafers can be built up on top of the two-wafer stack by a similar wafer-stacking method. After stacking, individual chips can be separated from the stacked wafers using a standard wafer-dicing process. The separated dies can withstand normal next board-level assembly processes including high temperature solder reflow process, requiring thermal treatment at about 310° C. for a few minutes.

Figure 7:
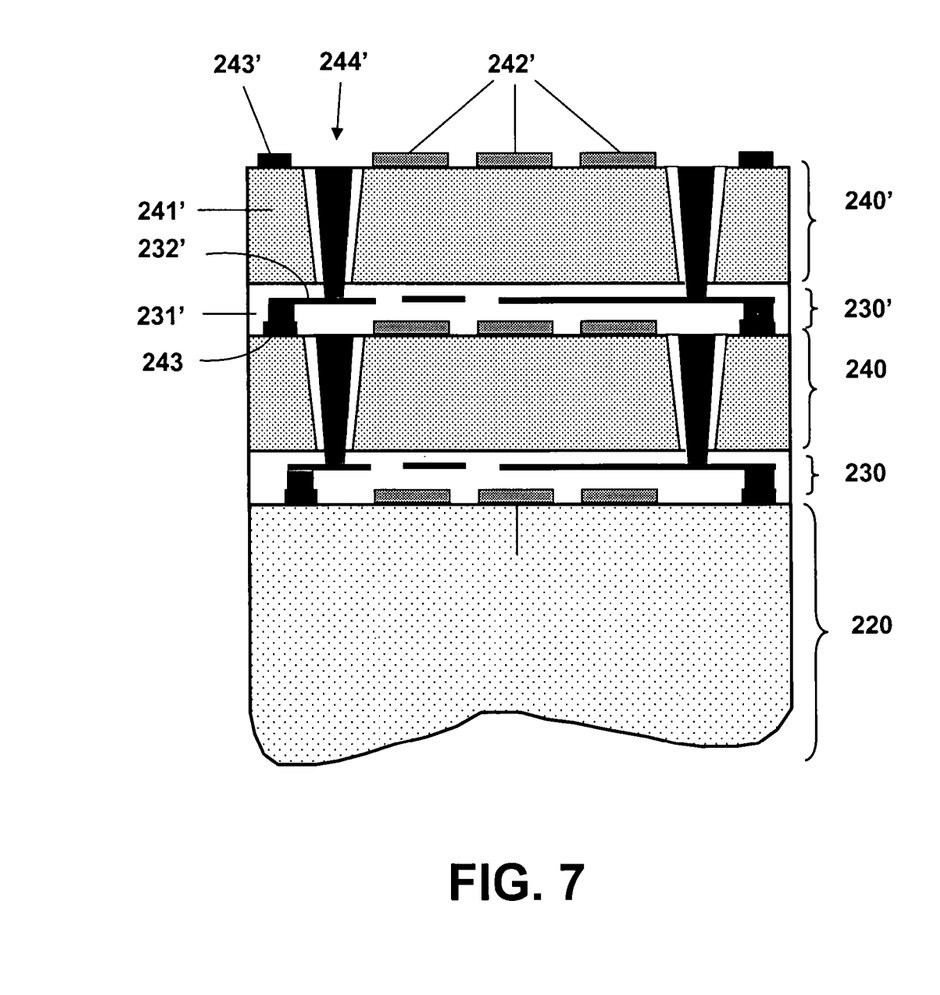
FIG. 7 shows a cross-sectional side view of a singulated stacked chip comprising a thick bottom wafer, a thin upper chip, and a stacked thin chip.

In FIG. 7 is shown an additional stacked layer on the thin chip 240, the additional stacked layer comprising a stacked interconnect layer 230' on the top surface of the thin upper chip 240, the stacked interconnect layer 230'comprising a compliant dielectric material 231' and an interconnect structure embedded in the compliant dielectric material 231', the interconnect structure comprising one or more via capture pads 232' connected to the associated input/output pads 243 on the top surface of the thin upper chip 240; and a stacked thin chip 240' on the stacked interconnect layer 230', the stacked thin chip 240' comprising one or more microsystem devices 242' with associated input/output pads 243' on the top surface of the stacked thin chip 240' that are connected to the one or more via capture pads 232' in the stacked interconnect layer 230' by conductive vias 244' through the stacked thin chip 240'. Additional thin chip and interconnect layers can be stacked on the stacked thin chip 240' using the wafer-stacking method.

The present invention has been described as a microsystem-on-a-chip package and a wafer-stacking method to assemble a microsystem-on-a-chip. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A microsystem-on-a-chip, comprising:
   a bottom chip comprising one or more microsystem devices with associated input/output pads on the top surface of the bottom chip;
   an interconnect layer on the top surface of the bottom chip, the interconnect layer comprising a compliant dielectric material and an interconnect structure embedded in the compliant dielectric material, the interconnect structure comprising one or more via capture pads connected to the associated input/output pads on the top surface of the bottom chip; and
   a thin upper chip on the interconnect layer, the thin upper chip comprising one or more microsystem devices with associated input/output pads on the top surface of the thin upper chip that are connected to the one or more via capture pads in the interconnect layer by conductive vias through the thin upper chip.

2. The microsystem-on-a-chip of claim 1, further comprising at least one additional stacked layer on the thin chip, each additional stacked layer comprising:
   a stacked interconnect layer on the top surface of the thin upper chip, the stacked interconnect layer comprising a compliant dielectric material and an interconnect structure embedded in the compliant dielectric material, the interconnect structure comprising one or more via capture pads connected to the associated input/output pads on the top surface of the thin upper chip
   a stacked thin chip on the stacked interconnect layer, the stacked thin chip comprising one or more microsystem devices with associated input/output pads on the top surface of the stacked thin chip that are connected to the one or more via capture pads in the stacked interconnect layer by conductive vias through the stacked thin chip.

3. The microsystem-on-a-chip of claim 1, wherein the interconnect layer has a thickness of less than 50 microns.

4. The microsystem-on-a-chip of claim 1, wherein the compliant dielectric material is a polymer.

5. The microsystem-on-a-chip of claim 4, wherein the polymer is benzocyclobutene.

6. The microsystem-on-a-chip of claim 1, wherein the thin upper chip has a thickness of less than 120 microns.

7. The microsystem-on-a-chip of claim 1, wherein the interconnect structure further comprises at least one passive component.

8. The microsystem-on-a-chip of claim 7, wherein the at least one passive component comprises a thin-film resistor.

9. The microsystem-on-a-chip of claim 7, wherein the at least one passive component comprises a multi-layer capacitor.

10. The microsystem-on-a-chip of claim 7, wherein the at least one passive component comprises a spiral inductor.

11. The microsystem-on-a-chip of claim 1, wherein the interconnect structure comprises copper.

12. The microsystem-on-a-chip of claim 1, wherein the one or more via capture pads are sized to control the alignment tolerance of the thin upper chip.

* * * * *